(12) United States Patent
Zhu

(10) Patent No.: US 11,050,030 B2
(45) Date of Patent: Jun. 29, 2021

(54) OLED DISPLAY AND OLED DISPLAY DEVICE

(71) Applicant: Wuhan China Star Optoelectronics Semiconductor Display Technology Co., Ltd., Wuhan (CN)

(72) Inventor: Zhitao Zhu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/642,030

(22) PCT Filed: Jan. 20, 2020

(86) PCT No.: PCT/CN2020/073110
§ 371 (c)(1),
(2) Date: Feb. 26, 2020

(87) PCT Pub. No.: WO2021/056939
PCT Pub. Date: Apr. 1, 2021

(65) Prior Publication Data
US 2021/0091318 A1    Mar. 25, 2021

(30) Foreign Application Priority Data
Sep. 25, 2019 (CN) .......................... 201910913264.9

(51) Int. Cl.
*H01L 23/58* (2006.01)
*H01L 21/00* (2006.01)
*H01L 51/00* (2006.01)
*H01L 27/32* (2006.01)
*B32B 5/18* (2006.01)
*B32B 7/12* (2006.01)
*H01L 51/52* (2006.01)

(52) U.S. Cl.
CPC ............ *H01L 51/0097* (2013.01); *B32B 5/18* (2013.01); *B32B 7/12* (2013.01); *H01L 27/323* (2013.01); *H01L 27/3244* (2013.01); *H01L 51/5281* (2013.01); *B32B 2457/206* (2013.01); *H01L 2251/5338* (2013.01)

(58) Field of Classification Search
CPC ................. H01L 51/0097; H01L 2251/5338
USPC ............. 438/82, 780; 257/639–644, 791–794
See application file for complete search history.

(56) References Cited

U.S. PATENT DOCUMENTS 9,171,890 B2 * 10/2015 Naijo .................. H01L 27/3267
9,285,835 B2 * 3/2016 Lee ........................ G06F 1/1656
(Continued)

FOREIGN PATENT DOCUMENTS

CN         104103217         10/2014
CN         207852678          9/2018
(Continued)

*Primary Examiner* — Calvin Lee

(57) ABSTRACT

An organic light-emitting diode (OLED) display screen and an OLED display device are provided. The OLED display screen has a first display region, a second display region, and a folded display region. A bonding region is disposed on a side edge of the second display region away from the folded display region. Only part of a first backplate disposed on the second display region close to the bonding region is retained and replaced with a buffer layer to ensure stability of a shape of the folded display region and prevent wave warping.

19 Claims, 3 Drawing Sheets

(56) References Cited

U.S. PATENT DOCUMENTS

| | | | | |
|---|---|---|---|---|
| 9,614,168 | B2* | 4/2017 | Zhang | H01L 51/004 |
| 9,769,919 | B2* | 9/2017 | Park | H01L 51/5253 |
| 9,773,853 | B2* | 9/2017 | Tao | H01L 27/3297 |
| 9,977,466 | B2* | 5/2018 | Kwon | G06F 1/1652 |
| 10,229,963 | B1 | 3/2019 | Qi et al. | |
| 10,637,007 | B1* | 4/2020 | Wang | H01L 27/3262 |
| 10,665,794 | B2* | 5/2020 | Cao | H01L 51/5281 |
| 10,734,612 | B2* | 8/2020 | Wu | H01L 25/0655 |
| 2018/0199426 | A1 | 7/2018 | Lee | |
| 2020/0103943 | A1* | 4/2020 | Huang | G09F 9/301 |
| 2021/0084778 | A1 | 3/2021 | Zhou et al. | |

FOREIGN PATENT DOCUMENTS

| | | |
|---|---|---|
| CN | 108962031 | 12/2018 |
| CN | 108962035 | 12/2018 |
| CN | 109087586 | 12/2018 |
| CN | 109461382 | 3/2019 |
| CN | 109728057 | 5/2019 |
| CN | 109994606 | 7/2019 |

\* cited by examiner

OLED DISPLAY AND OLED DISPLAY DEVICE

RELATED APPLICATIONS

This application is a National Phase of PCT Patent Application No. PCT/CN2020/073110 having International filing date of Jan. 20, 2020, which claims the benefit of priority of Chinese patent application No. 201910913264.9 filed on Sep. 25, 2019. The contents of the above applications are all incorporated by reference as if fully set forth herein in their entirety.

FIELD AND BACKGROUND OF THE INVENTION

The present disclosure relates to the field of display technologies, and in particular, to an organic light-emitting diode (OLED) display screen and an OLED display device.

With wide application of organic light-emitting diode (OLED) technology in display panel industry, a biggest advantage of OLED displays lies in their flexible and foldable characteristics. Currently, a new type of foldable and flexible display device has been developed, which can fold a screen in half. The display screen is small when folded, and is convenient to carry. Meanwhile, the display screen is large when expanded and provides better visual effect, thereby improving user experience.

However, in a folding and bending process of the foldable and flexible display device, an OLED display screen will be subject to stresses such as tensile stress, and film layers in the OLED display screen cannot be stretched, leading to problems such as wave warping due to extrusion and deformation of materials when the OLED display screen is being folded and bent, and even causing damage to the materials such as internal array substrate lines and light-emitting devices, resulting in an occurrence of electrical, optical, and other problems.

In summary, there is a need to provide a new OLED display screen and OLED display device to solve the above technical problems.

SUMMARY OF THE INVENTION

Technical Problem

The present disclosure provides an organic light-emitting diode (OLED) display screen and an OLED display device, to solve the technical problem of wave warping due to the extrusion deformation of the material when a conventional OLED display screen in the folding and bending process.

Technical Solutions

To solve the above problems, the technical solutions provided by the present disclosure are as follows.

An embodiment of the present disclosure provides an organic light-emitting diode (OLED) display screen, the OLED display screen including a foldable first display region and a foldable second display region, and a folded display region positioned between the first display region and the second display region, wherein the first display region and the second display region are stacked after the first display region and the second display region are folded, a bonding region is disposed on a side edge of the second display region away from the folded display region, the bonding region includes a bending region and a non-bending region, the bending region is disposed between the second display region and the non-bending region; and a chip on film is disposed on a display panel corresponding to the bonding region, wherein the OLED display screen includes at least:

the display panel; and a first backplate disposed on at least part of the second display region close to the bonding region, wherein the display panel is disposed on the first backplate.

According to the OLED display screen provided by the embodiment of the present disclosure, the OLED display screen further including a buffer layer, wherein the buffer layer is disposed on the first display region, the folded display region, and the second display region, and the buffer layer covers the first backplate.

According to the OLED display screen provided by the embodiment of the present disclosure, the OLED display screen further including a second backplate, wherein the second backplate is disposed on the non-bending region, and the second backplate is disposed on a side of the display panel close to the second display region.

According to the OLED display screen provided by the embodiment of the present disclosure, a size of the first backplate in a first direction is greater than or equal to a size of the second backplate in the first direction, the first direction is a direction perpendicular to an extending direction of a bending axis of the bonding region, and the OLED display screen is bent along the bending axis.

According to the OLED display screen provided by the embodiment of the present disclosure, the size of the first backplate in the first direction ranges from 5 mm to 15 mm, and the size of the second backplate in the first direction ranges from 2 mm to 5 mm.

According to the OLED display screen provided by the embodiment of the present disclosure, a material of the buffer layer is a foam.

An embodiment of the present disclosure provides an organic light-emitting diode (OLED) display screen, the OLED display screen including a foldable first display region and a foldable second display region, and a folded display region positioned between the first display region and the second display region, wherein the first display region and the second display region are stacked after the first display region and the second display region are folded, and a bonding region is disposed on a side edge of the second display region away from the folded display region, wherein the OLED display screen includes at least:

a display panel; and a first backplate disposed on at least part of the second display region close to the bonding region, wherein the display panel is disposed on the first backplate.

According to the OLED display provided by the embodiment of the present disclosure, the OLED display screen further including a buffer layer, wherein the buffer layer is disposed on the first display region, the folded display region, and the second display region, and the buffer layer covers the first backplate.

According to the OLED display provided by the embodiment of the present disclosure, the bonding region includes a bending region and a non-bending region, and the bending region is disposed between the second display region and the non-bending region.

According to the OLED display provided by the embodiment of the present disclosure, the OLED display screen further including a second backplate, wherein the second backplate is disposed on the non-bending region, and the second backplate is disposed on a side of the display panel close to the second display region.

According to the OLED display provided by the embodiment of the present disclosure, a size of the first backplate in a first direction is greater than or equal to a size of the second backplate in the first direction, the first direction is a direction perpendicular to an extending direction of a bending axis of the bonding region, and the OLED display screen is bent along the bending axis.

According to the OLED display provided by the embodiment of the present disclosure, the size of the first backplate in the first direction ranges from 5 mm to 15 mm, and the size of the second backplate in the first direction ranges from 2 mm to 5 mm.

According to the OLED display provided by the embodiment of the present disclosure, a thickness of the first backplate and the second backplate range from 40 µm to 75 µm.

According to the OLED display provided by the embodiment of the present disclosure, a reinforcing plate is disposed between the first backplate and the second backplate.

According to the OLED display provided by the embodiment of the present disclosure, a material of the buffer layer is foam.

According to the OLED display provided by the embodiment of the present disclosure, the OLED display screen further including:
 a touch layer disposed on the display panel; and
 a polarizer disposed on the touch layer;
 wherein the display panel and the touch layer are connected by a first adhesive layer, and the touch layer and the polarizer are connected by a second adhesive layer.

According to the OLED display provided by the embodiment of the present disclosure, the first adhesive layer and the second adhesive layer are an optical glue.

According to the OLED display provided by the embodiment of the present disclosure, a thickness of each of the first adhesive layer and the second adhesive layer is 100 µm.

According to the OLED display provided by the embodiment of the present disclosure, a chip on film is disposed on the display screen of the bonding region.

An embodiment of the present disclosure provides an organic light-emitting diode (OLED) display device including the OLED display screen described above.

Beneficial Effect

The beneficial effect of the present disclosure is that the OLED display screen and the OLED display device are provided in the embodiments of the present disclosure. By reducing the size of the first backplate for supporting the display panel, and merely retaining a part of the first backplate disposed on at least part of the second display region close to the bonding region and replacing it with a buffer layer, stability of the shape of the folded display region of the OLED display can be ensured, and the occurrence of wave warping due to extrusion and deformation of the materials in the folding and bending process of the OLED display screen can be reduced.

BRIEF DESCRIPTION OF THE SEVERAL VIEWS OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DESCRIPTION OF SPECIFIC EMBODIMENTS OF THE INVENTION

Figure 1:
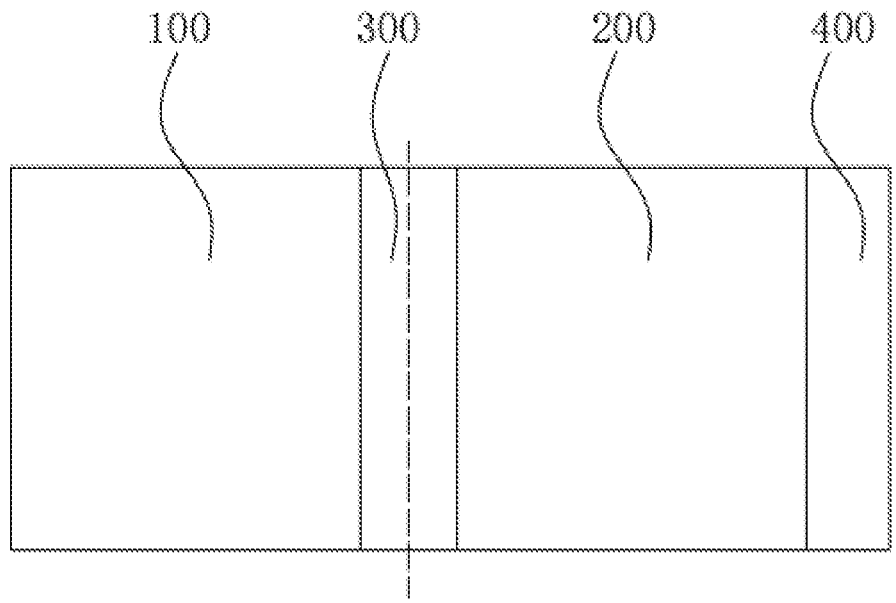
FIG. 1 is a schematic plane structural diagram of an organic light-emitting diode (OLED) display screen when it is unfolded according to an embodiment of the present disclosure.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The present disclosure is directed at an organic light-emitting diode (OLED) display screen and an OLED display device in the conventional art, which see an occurrence of wave warping due to extrusion and deformation of materials in a folding and bending process, and the present embodiment can solve this defect.

Figure 2:
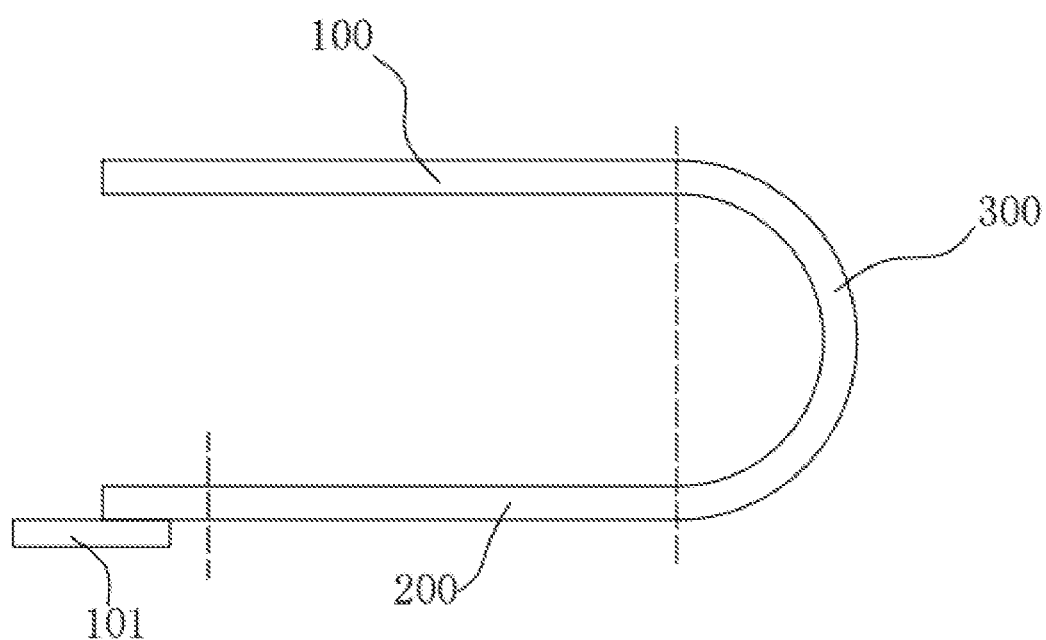
FIG. 2 is a schematic structural diagram of the OLED display screen in FIG. 1 when it is folded.

Please refer to FIG. 1 and FIG. 2, where an OLED display screen provided by an embodiment of the present disclosure has a foldable first display region 100 and a foldable second display region 200, and a folded display region 300 positioned between the first display region 100 and the second display region 200. The first display region 100 and the second display region 200 can be folded along a central axis of the folded display region, and the first display region 100 and the second display region 200 are stacked after the first display region 100 and the second display region 200 are folded. The folded display region 300 is positioned at a side of the OLED display screen. The first display region 100 and the second display region 200 are used to display a main display screen, and the folded display region 300 is used to display application information, including indication information such as signal information, power, and time. The folded display region 300 does not affect the actual use of the user, and the folded display region 300 can be used to adjust the OLED display screen to a folded state, thereby reducing an occupied space of the display device and facilitating portability.

A bonding region 400 is disposed on a side edge of the second display region 200 away from the folded display region 300, and used for bonding a display driving circuit and a flexible circuit board connected to the display driving circuit. Specifically, a chip on film (COF) 101 is disposed on a display panel 106 of the bonding region 400, that is, a driving integrated circuit is fixed on the flexible circuit board.

Figure 3:
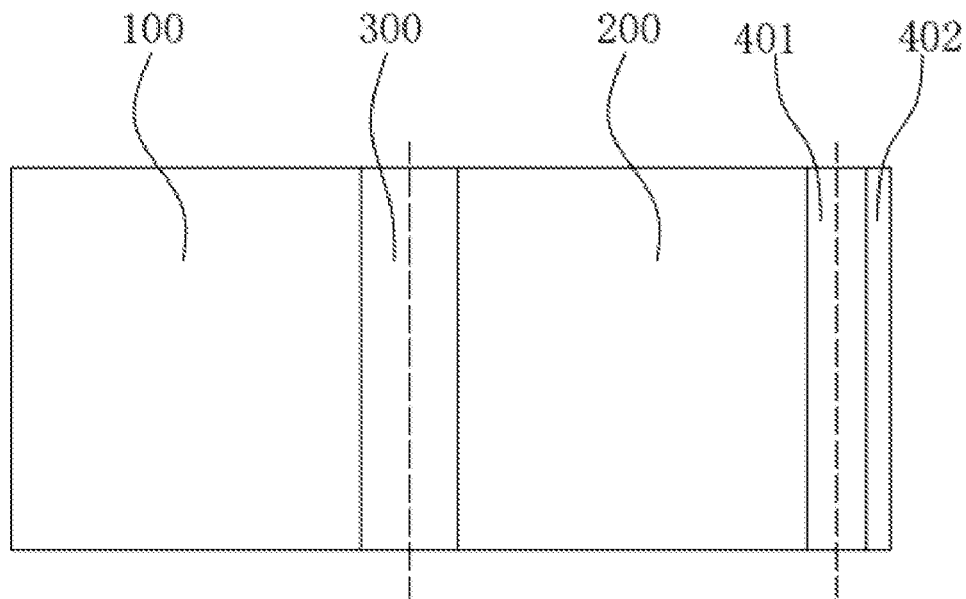
FIG. 3 is a schematic plane structural diagram of another OLED display screen when it is unfolded according to an embodiment of the present disclosure.
Figure 4:
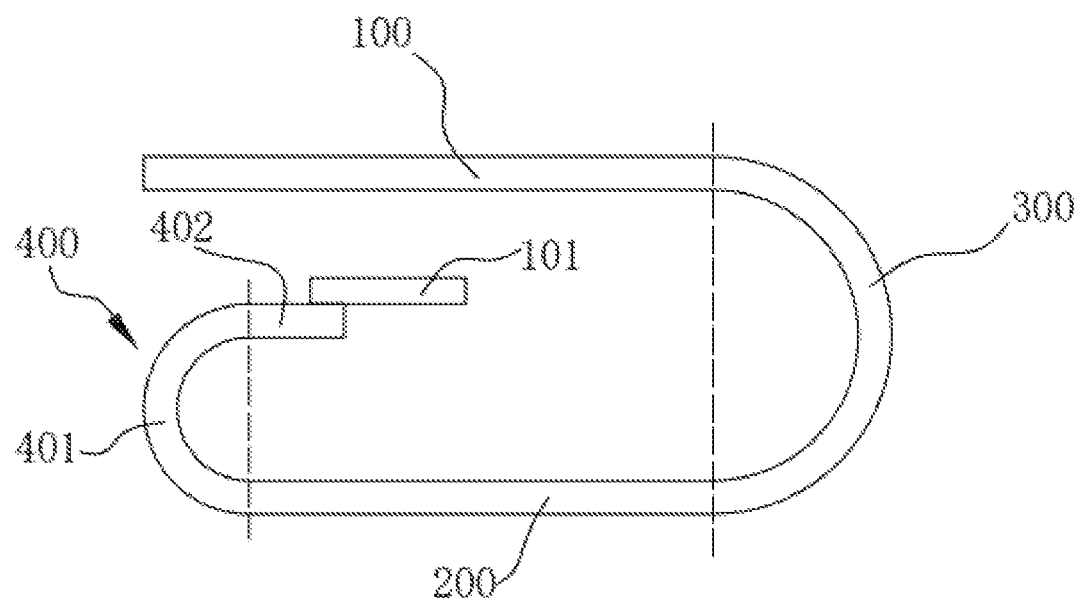
FIG. 4 is a schematic structural diagram of the OLED display screen in FIG. 3 when it is folded.

Furthermore, referring to FIG. 3 and FIG. 4, which the following modifications are made on the basis of FIG. 1 and FIG. 2. In order to further increase screen-to-body ratio of the OLED display screen to achieve a narrow border or even a borderless design, the bonding region is 400 is bent and fixed on a back of the second display region 200.

In order to explain the technical solution of the present disclosure, the embodiment of the present disclosure is illustrated with the bonding region 400 being bent as an example.

Figure 5:
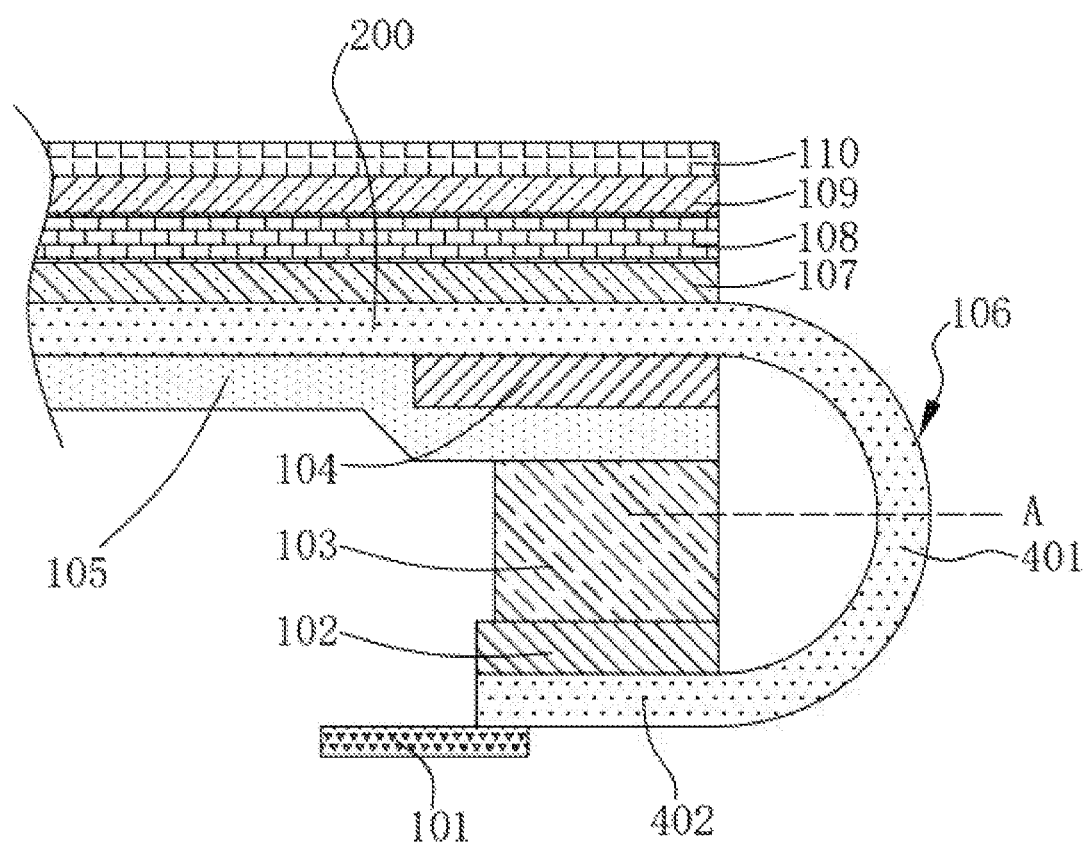
FIG. 5 is a partially enlarged cross-sectional view of the OLED display screen in FIG. 4.

FIG. 5 is a partially enlarged cross-sectional view of the OLED display screen, where the OLED display screen includes at least a display panel 106 and a first backplate 104 for supporting the display panel 106. Specifically, the display panel 106 provided by the embodiment of the present disclosure can be an organic light-emitting diode display panel that has a certain flexibility.

The bonding region 400 includes a bending region 401 and a non-bending region 402. The bending region 401 is disposed between the second display region 200 and the non-bending region 402, and the bending region 401 is bent along a bending axis and toward the back of the second display region 200. The non-bending region 402 can be folded into a cavity enclosed by the first display region 100, the second display region 200, and the folded display region 300. The bending region 401 and the folded display region 300 are oppositely disposed. Compared with folding the bending region 401 to a front of the second display region 200, a thickness of the OLED display screen can be reduced. It should be noted that the back of the second display region 200 refers to a surface opposite to a display surface of the display panel 106.

Specifically, a bending radius of the bending region 401 is less than a bending radius of the folded display region 300, so that the cavity enclosed by the first display region 100, the second display region 200, and the folded display region 300 can completely accommodate the bending region 401. Moreover, poor display caused by the bending region 401 being in contact with the first display region 100, the second display region 200, and the folded display region 300 can be prevented.

The first backplate 104 is disposed on at least part of the second display region 200 close to the bonding region 400. In the embodiment of the present disclosure, the first backplate 104 is disposed on the back of the second display region 200, and the display panel 106 is disposed on the first backplate 104. In one aspect, a section of the first backplate 104 is reserved in the second display region 200 close to the bonding region 400, which can meet better support conditions required by current bonding technologies. In another aspect, since the first backplate 104 is merely disposed on part of the second display region 200 and is not disposed on the folded display region 300, this can alleviate the occurrence of wave warping in the folded display region 300 due to the extrusion and deformation of the materials in the folding and bending process of the OLED display screen.

Furthermore, the OLED display screen further includes a buffer layer 105. The buffer layer 105 can be disposed on the first display region 100, the folded display region 300, and the second display region 200. The buffer layer 105 covers the first backplate 104. In the embodiment of the present disclosure, a material of the buffer layer 105 is foam. Because the foam has small micropores inside, it has characteristics of good elasticity and light weight, which can play a role of compression resistance, cushioning, and support for the display panel 106. At the same time, the foam can be bent, and its bending performance is weaker than the display panel 106. When the folded display region 300 is bent, the foam can be used to apply a certain supporting force to the folded display region 300 to prevent local stress integration, thereby further alleviating the occurrence of wave warping in the folded display region 300 due to the extrusion and deformation of the materials in the folding and bending process of the OLED display screen. Of course, in other embodiments, the buffer layer 105 can also use other materials, and the present disclosure should not be limited thereto.

The OLED display screen further includes a second backplate 102 disposed on the non-bending region 402, and the second backplate 102 is disposed on a side of the display panel 106 close to the second display region 200 and used to support the display panel 106 and the chip on film 101. The second backplate 102 and the first backplate 104 are oppositely disposed. A reinforcing plate 103 is disposed between the first backplate 104 and the second backplate 102. In one aspect, it can play a certain heightening function to increase the bending radius of the bending region 401 and prevent the bending region 401 from fracturing due to the bending radius being too small. In another aspect, it can support the first backplate 104 and the second backplate 102, thereby increasing the stability of the OLED display screen.

Furthermore, in order to maintain a surface flatness of the second backplate 102, a size of the first backplate 104 in a first direction A is greater than or equal to a size of the second backplate 102 in the first direction A, where the first direction A is a direction perpendicular to an extending direction of the bending axis of the bonding region 400, and the OLED display screen is bent around the bending axis.

Specifically, a size of the first backplate 104 in the first direction A ranges from 5 mm to 15 mm, a size of the second backplate 102 in the first direction A ranges from 2 mm to 5 mm, and a thickness of the backplate 104 and the second backplate 102 ranges from 40 μm to 75 μm.

The OLED display screen further includes a touch layer 108 disposed on the display panel and a polarizer 110 disposed on the touch layer 108, wherein the display panel 106 and the touch layer 108 are connected by a first adhesive layer 107, and the touch layer 108 and the polarizer 110 are connected by a second adhesive layer 109. Specifically, the first adhesive layer 107 and the second adhesive layer 109 can be an optically clear adhesive (OCA). A thickness of the first adhesive layer 107 and the second adhesive layer 109 is about 100 μm. After the OLED display is folded and bent, the first adhesive layer 107 and the second adhesive layer 109 can be relatively stretched.

Since the display panel 106 can be supported and protected by the touch layer 107, the polarizer 109, the first adhesive layer 108, and the second adhesive layers 110 before the bending region 401 of the OLED display screen is bent, therefore, in the embodiment of the present disclosure, a cover plate can be omitted for the OLED display screen.

An embodiment of the present disclosure further provides an OLED display device including the above OLED display screen. The OLED display device can be a mobile phone, a tablet computer, a television, a display, a notebook computer, a digital camera frame, a navigator, or any other product or component having a display function.

The beneficial effect of the present disclosure is that the OLED display screen and the OLED display device are provided in the embodiments of the present disclosure. By reducing the size of the first backplate for supporting the display panel, and merely retaining a part of the first backplate disposed on at least part of the second display region close to the bonding region and replacing it with a buffer layer, stability of the shape of the folded display region of the OLED display can be ensured, and the occurrence of wave warping due to extrusion and deformation of the materials in the folding and bending process of the OLED display screen can be reduced.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic light-emitting diode (OLED) display screen, comprising a foldable first display region and a foldable second display region, and a folded display region positioned between the first display region and the second display region, wherein the first display region and the second display region are stacked after the first display region and the second display region are folded, and a bonding region is disposed on a side edge of the second display region away from the folded display region, wherein the OLED display screen comprises at least:
   a display panel; and
   a first backplate disposed on at least part of the second display region close to the bonding region, wherein the display panel is disposed on the first backplate;
   a buffer layer disposed on the first display region; and
   a reinforcing plate disposed between the first backplate and the second backplate, wherein the reinforcing plate is in direct contact with the buffer layer.

2. The OLED display screen according to claim 1, wherein a chip on film is disposed on the display panel corresponding to the bonding region.

3. An organic light-emitting diode (OLED) display device, comprising the OLED display screen of claim 1.

4. The OLED display screen according to claim 1, wherein the folded display region, and the second display region, and the buffer layer covers the first backplate.

5. The OLED display screen according to claim 4, wherein a material of the buffer layer is foam.

6. The OLED display screen according to claim 1, further comprising:
   a touch layer disposed on the display panel; and
   a polarizer disposed on the touch layer;
   wherein the display panel and the touch layer are connected by a first adhesive layer, and the touch layer and the polarizer are connected by a second adhesive layer.

7. The OLED display screen according to claim 6, wherein a thickness of each of the first adhesive layer and the second adhesive layer is 100 μm.

8. The OLED display screen according to claim 6, wherein the first adhesive layer and the second adhesive layer are an optical glue.

9. The OLED display screen according to claim 1, wherein the bonding region comprises a bending region and a non-bending region, and the bending region is disposed between the second display region and the non-bending region.

10. The OLED display screen according to claim 9, further comprising a second backplate, wherein the second backplate is disposed on the non-bending region, and the second backplate is disposed on a side of the display panel close to the second display region.

11. The OLED display screen according to claim 10, wherein a size of the first backplate in a first direction is greater than or equal to a size of the second backplate in the first direction, the first direction is a direction perpendicular to an extending direction of a bending axis of the bonding region, and the OLED display screen is bent along the bending axis.

12. The OLED display screen according to claim 11, wherein the size of the first backplate in the first direction ranges from 5 mm to 15 mm, and the size of the second backplate in the first direction ranges from 2 mm to 5 mm.

13. The OLED display screen according to claim 11, wherein a thickness of the first backplate and the second backplate ranges from 40 μm to 75 μm.

14. An organic light-emitting diode (OLED) display screen, comprising a foldable first display region and a foldable second display region, and a folded display region positioned between the first display region and the second display region, wherein the first display region and the second display region are stacked after the first display region and the second display region are folded, a bonding region is disposed on a side edge of the second display region away from the folded display region, the bonding region comprises a bending region and a non-bending region, the bending region is disposed between the second display region and the non-bending region, and a chip on film is disposed on a display panel corresponding to the bonding region, wherein the OLED display screen comprises at least:
   the display panel;
   a first backplate disposed on at least part of the second display region close to the bonding region, wherein the display panel is disposed on the first backplate;
   a buffer layer disposed on the first display region; and
   a reinforcing plate disposed between the first backplate and the second backplate, wherein the reinforcing plate is in direct contact with the buffer layer.

15. The OLED display screen according to claim 14, wherein the folded display region, and the second display region, and the buffer layer covers the first backplate.

16. The OLED display screen according to claim 15, wherein a material of the buffer layer is foam.

17. The OLED display screen according to claim 14, further comprising a second backplate, wherein the second backplate is disposed on the non-bending region, and the second backplate is disposed on a side of the display panel close to the second display region.

18. The OLED display screen according to claim 17, wherein a size of the first backplate in a first direction is greater than or equal to a size of the second backplate in the first direction, the first direction is a direction perpendicular to an extending direction of a bending axis of the bonding region, and the OLED display screen is bent along the bending axis.

19. The OLED display screen according to claim 18, wherein the size of the first backplate in the first direction ranges from 5 mm to 15 mm, and the size of the second backplate in the first direction ranges from 2 mm to 5 mm.

* * * * *